United States Patent
Soeraasen

(10) Patent No.: US 7,167,029 B2
(45) Date of Patent: Jan. 23, 2007

(54) SAMPLING AND LEVEL SHIFTING CIRCUIT

(75) Inventor: Runar Soeraasen, Vikhammer (NO)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/043,669

(22) Filed: Jan. 25, 2005

(65) Prior Publication Data

US 2006/0158231 A1  Jul. 20, 2006

(51) Int. Cl.
*G11C 27/02*  (2006.01)
*H03K 5/00*  (2006.01)
(52) U.S. Cl. .......................... 327/91; 327/94
(58) Field of Classification Search ................. 327/50, 327/91, 94, 337; 341/122–125
See application file for complete search history.

(56) References Cited

U.S. PATENT DOCUMENTS 5,821,780 A * 10/1998 Hasegawa .................... 327/63
6,144,232 A * 11/2000 Yukawa et al. .............. 327/77
6,215,337 B1 * 4/2001 Bazarjani ..................... 327/91
6,700,417 B2 * 3/2004 Kawahito et al. ............ 327/94

FOREIGN PATENT DOCUMENTS

EP          717416 A2 *  6/1996

* cited by examiner

*Primary Examiner*—Quan Tra
*Assistant Examiner*—Rey Aranda
(74) *Attorney, Agent, or Firm*—Sawyer Law Group LLP

(57) ABSTRACT

A circuit comprising a first switch for sampling a differential signal and a second switch for level-shifting the sampled differential signal is disclosed. The first and second switches are cross-coupled to cancel a charge injected between the first and second switches and for linearizing the charge transfer; and a capacitor coupled is between the first and second switches. A circuit in accordance with the present invention adds an extra sampling switch to the sampling circuit and an extra charge-transfer switch in the level-shifting circuit. By cross-coupling these extra switches, the result is a cancellation of the charge-injection, and thus linearizing the charge transfer.

13 Claims, 2 Drawing Sheets

SAMPLING AND LEVEL SHIFTING CIRCUIT

FIELD OF THE INVENTION

The present invention relates generally to circuitry and more specifically to sampling and level shifting circuitry.

BACKGROUND OF THE INVENTION

In many types of circuits it is desirable to cancel the effects of parasitic nonlinear capacitances when sampling and level shifting differential voltages. Examples of such circuits are analog to digital converters (ADCs) and digital signal processors. In a circuit which has a 2.5 differential voltage, a sampling capacitor of 20 picoFarads is employed to suppress the effect of the non-linear capacitances. This large capacitance can significantly affect the cost of an integrated circuit as well as significantly add to the area of the circuitry.

Accordingly, what is needed is a system and method for providing sampling and level shifting circuitry which does not require large capacitances and therefore is less costly and utilizes less area in an integrated circuit. The circuitry, system and method should be easily implemented, adaptable and cost effective The present invention addresses such a need.

SUMMARY OF THE INVENTION

A circuit comprising a first switch for sampling a differential signal and a second switch for level-shifting the sampled differential signal is disclosed. The first and second switches are cross-coupled to cancel a charge injected between the first and second switches and for linearizing the charge transfer; and a capacitor coupled is between the first and second switches.

A circuit in accordance with the present invention adds an extra sampling switch to the sampling circuit and an extra charge-transfer switch in the level-shifting circuit. By cross-coupling these extra switches, the result is a cancellation of the charge-injection, and thus linearizing the charge transfer.

DETAILED DESCRIPTION

The present invention relates generally to circuitry and more specifically to sampling and level shifting circuitry. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
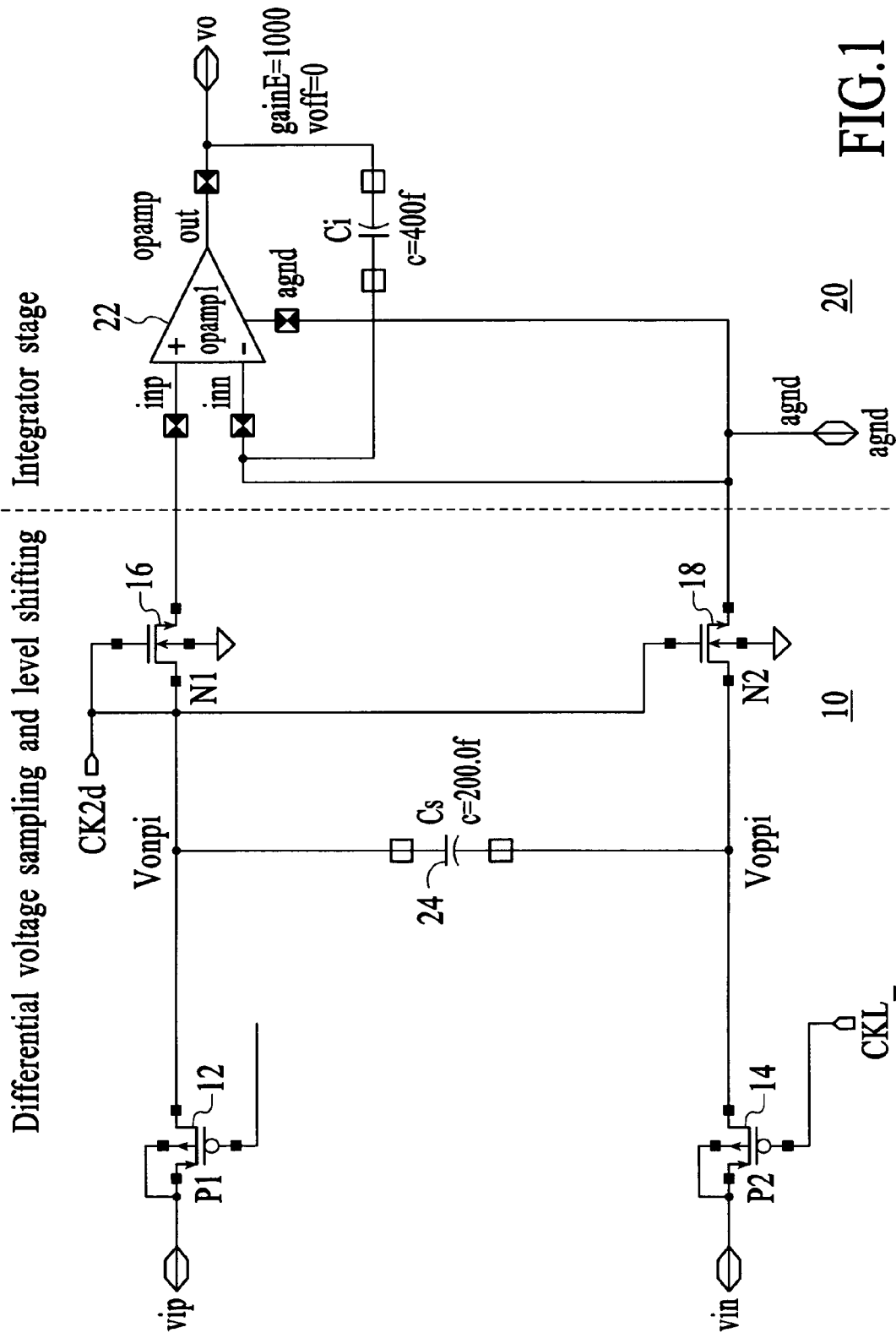
FIG. 1 is a diagram of a conventional sampling and level shifting circuit.

Circuitry to cancel the effect of parasitic non-linear capacitances when sampling and level-shifting differential voltages is disclosed. FIG. 1 is a diagram of a conventional sampling and level shifting circuit 10. The sampling level shifting circuit 10 comprises a first PMOS transistor 12 which receives a first voltage Vip (for example 20.5 volts) and a second PFET transistor 14 which receives a second voltage Vin (for example 18 volts). Transistor 12 is coupled to NFET transistor 16 and transistor 14 is coupled to NFET transistor 18. This circuit 10 is coupled to an integration stage 20. The integration stage comprises an operational amplifier 22 which receives the sampled and level shifted signal from circuit 10 and provides an output voltage. Transistors 12 and 14 provide for the sampling of the signal and transistors 16 and 18 provide for the level shifting of the differential voltage. As is seen, a capacitor 24 is employed to suppress the effect on non-linear capacitances.

The main parasitic non-linear capacitance is due to the reversed biased drain-to-bulk diode in sampling transistors 12 and 14. In the sampling clock phase (CKL and CKH) the sampling capacitor 24 is charged to the differential voltage between Vip and Vin and the diode is shorted. In the charge transfer clock phase (CK2$d$) the drain of the sampling transistors 12 and 14 is driven to virtual ground. The bulk node of the sampling transistors are approximately kept at a constant level.

The change in reverse voltage on the drain-to-bulk diode results in an extra charge injected on the Voppi and Vonpi nodes between the sampling transistors 12 and 14 and the level shifting transistors 16 and 18. The amount of charge injected is a non-linear function of Vip and Vin circuitry in accordance with the present invention.

A circuit in accordance with the present invention adds an extra sampling switch to the sampling circuit and an extra charge-transfer switch in the level-shifting circuit. By cross-coupling these extra switches the result is a cancellation of the charge-injection, and thus linearizing the charge transfer.

Figure 2:
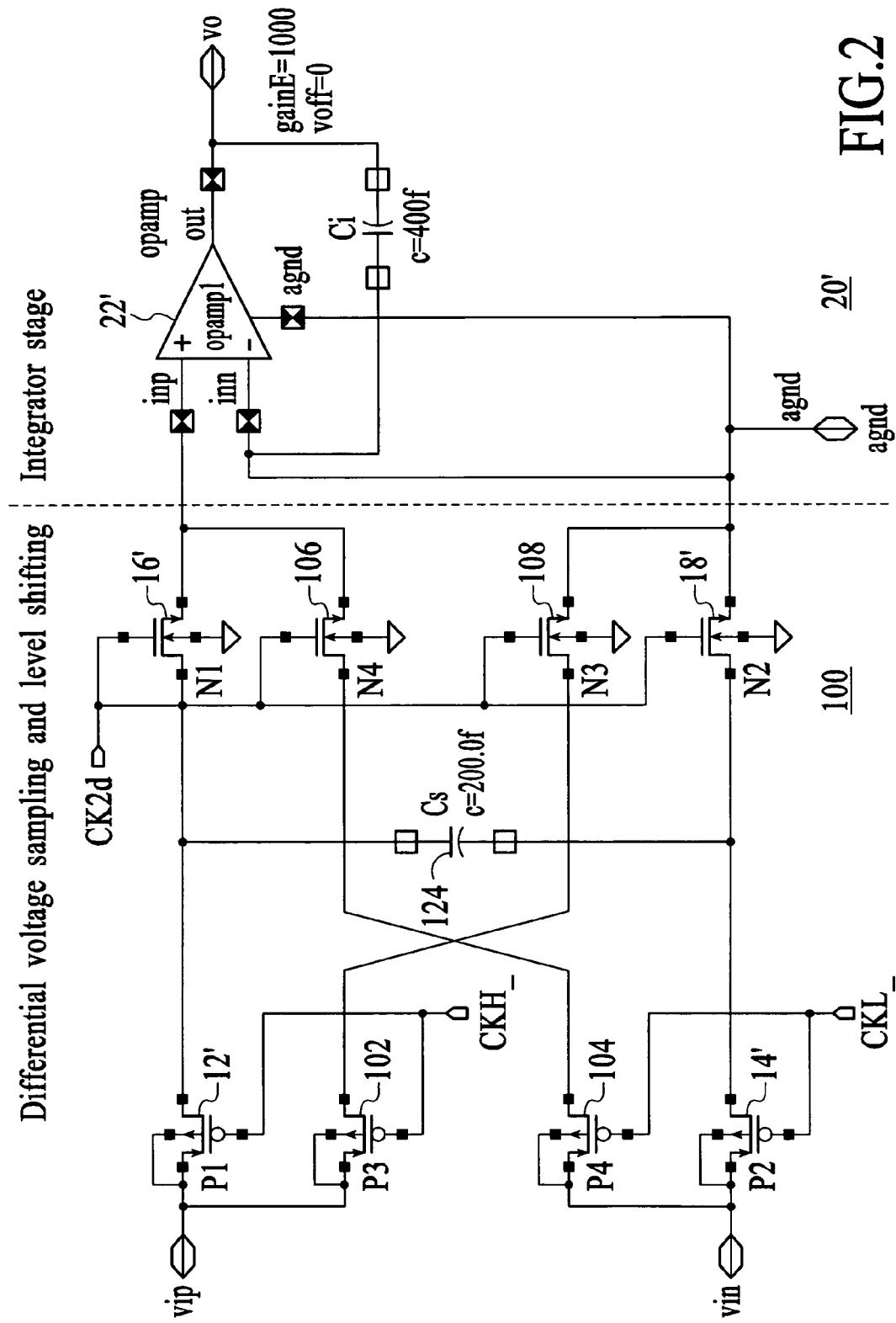
FIG. 2 is a diagram of a sampling and level shifting circuit in accordance with the present invention.

To more particularly describe the features of the present invention in more detail refer now to the following description in conjunction with the accompanying figures. FIG. 2 is a diagram of a sampling and level shifting circuit 100 in accordance with the present invention. The circuit 100 includes many of the same elements as circuit 10 of FIG. 1 and they have similar designators.

As is seen, however, there are two additional PFET transistors 102 and 104 coupled to sampling transistors 12' and 14' respectively. In addition, there are two additional NFET transistors 106 and 108 coupled to level shifting transistors 16' and 18' respectively. The gates of transistors 12' and 102' are coupled to a common clock signal (CKH). The gates of transistors 14' and 104 are coupled to a common clock signal (CKL). The gates of transistors 16', 106, 18' and 108 are coupled to a common clock signal (CK2$d$). Transistors 102 and 104 are cross coupled with transistors 106 and 108 respectively.

A circuit in accordance with the present invention adds an extra sampling switch to the sampling circuit and an extra charge-transfer switch in the level shifting circuit. By cross-coupling these extra switches the result is a cancellation of the charge-injection, and thus linearizing the charge transfer.

The circuitry in accordance with the present invention reduces the needed size of the sampling capacitor, and thus the circuit area and production cost. Accordingly, the capacitor 124 could be, for example, 200 femtoFarads as opposed to 20 picoFarads for capacitor 24 of FIG. 1. This reduction in capacitance correspondingly significantly reduces the size of the capacitor and its cost.

Although the present invention has been described in accordance with the embodiments shown, one of ordinary skill in the art will readily recognize that there could be variations to the embodiments and those variations would be within the spirit and scope of the present invention. For example, although a certain configuration of PFET and NFET transistors are shown one of ordinary skill in the art readily recognizes other configurations could be utilized and they would be within the spirit and scope of the present invention. Furthermore, although two transistors are added to each sampling switch and level shifting switch, one of ordinary skill in the art readily recognizes that any number of transistors could be utilized and the resulting circuit would be within the spirit and scope of the present invention. In addition, although a differential signal of 2.5 volts is disclosed, one of ordinary skill in the art readily recognizes that the differential could be any value and the resulting circuit would be within the spirit and scope of the present invention. Accordingly, many modifications may be made by one of ordinary skill in the art without departing from the spirit and scope of the appended claims.

What is claimed is:

1. A circuit comprising:
   a first switch for sampling a differential signal;
   a second switch for level-shifting the sampled differential signal, wherein the first and second switches are cross-coupled to cancel a charge injected between the first and second switches and for linearizing the charge transfer; and
   a capacitor coupled between the first and second switches, wherein the circuit is coupled to an integration stage.

2. The circuit of claim 1 wherein the first switch comprises first and second sampling transistors adapted to be coupled to a first voltage; and a third and fourth sampling transistor adapted to be coupled to a second voltage; and
   wherein the second switch comprises first and second level-shifting transistors coupled together, wherein the first level shifting transistor is coupled to the first sampling transistor and the second level shifting transistor is cross-coupled to the fourth sampling transistor; and third and fourth level shifting transistors coupled together and coupled to the first and second level shifting transistors, wherein the third level shifting transistor is coupled to the third sampling transistor and the fourth level shifting transistor is cross-coupled to the second sampling transistor.

3. The circuit of claim 2 wherein the first, second, third and fourth sampling transistors are PFET transistors and the first, second, third and fourth level-shifting transistors are NFET transistors.

4. The circuit of claim 1 wherein the capacitor is coupled across the first and second switches.

5. The circuit of claim 2 wherein the capacitor is coupled in parallel with the first, second, third and fourth sampling transistors and the first, second, third and fourth level shifting transistors.

6. A circuit comprising:
   a first switch for sampling a differential signal, the first switch comprising a first plurality of transistors adapted to be coupled to first and second voltages;
   a second switch for level shifting the sampled differential voltage; the second switch comprising a second plurality of transistors; which at least one of the first plurality of transistors is cross-coupled to at least one of the second plurality of transistors to cancel a charge injected between the first and second switches and for linearizing the charge transfer; and
   a capacitor coupled between the first and second switches wherein the circuit is coupled to an integration stage.

7. The circuit of claim 6 wherein the first plurality of transistors comprise PFET transistors and the second plurality of transistors comprise NFET transistors.

8. The circuit of claim 6 wherein the capacitor is coupled across the first and second switches.

9. The circuit of claim 6 wherein the capacitor is coupled in parallel with the first and second plurality of transistors.

10. A circuit comprising:
    a first switch for sampling a differential signal, the first switch comprising a first plurality of transistors adapted to be coupled to first and second voltages;
    a second switch for level shifting the sampled differential voltage; the second switch comprising a second plurality of transistors; which at least one of the first plurality of transistors is cross-coupled to at least one of the second plurality of transistors to cancel a charge injected between the first and second switches and for linearizing the charge transfer; and
    a capacitor coupled between the first and second switches wherein the capacitor is coupled in parallel with the first and second plurality of transistor.

11. A method comprising:
    providing a first switch for sampling a differential signal;
    providing a second switch for level-shifting the sampled differential signal, wherein the first and second switches are cross-coupled to cancel a charge injected between the first and second switches and for linearizing the charge transfer; and
    a capacitor coupled between the first and second switches wherein the circuit is coupled to an integration stage.

12. A method comprising:
    providing a first switch for sampling a differential signal, the first switch comprising a first plurality of transistors adapted to be coupled to first and second voltages;
    providing a second switch for level shifting the sampled differential voltage; the second switch comprising a second plurality of transistors; which at least one of the first plurality of transistors is cross-coupled to at least one of the second plurality of transistors to cancel a charge injected between the first and second switches and for linearizing the charge transfer; and
    providing a capacitor coupled between the first and second switches wherein the circuit is coupled to an integration stage.

13. A method comprising:
    providing a first switch for sampling a differential signal, the first switch comprising a first plurality of transistors adapted to be coupled to first and second voltages;
    providing a second switch for level shifting the sampled differential voltage; the second switch comprising a second plurality of transistors; which at least one of the first plurality of transistors is cross-coupled to at least one of the second plurality of transistors to cancel a charge injected between the first and second switches and for linearizing the charge transfer; and
    providing a capacitor coupled between the first and second switches wherein the capacitor is coupled in parallel with the first and second plurality of transistor.

* * * * *